(12) United States Patent
Araya et al.

(10) Patent No.: US 10,938,368 B2
(45) Date of Patent: Mar. 2, 2021

(54) PIEZOELECTRIC-RESONATOR-MOUNTING SUBSTRATE, AND PIEZOELECTRIC RESONATOR UNIT AND METHOD OF MANUFACTURING THE PIEZOELECTRIC RESONATOR UNIT

(71) Applicant: Murata Manufacturing Co., Ltd., Nagaokakyo (JP)

(72) Inventors: Hiroyuki Araya, Nagaokakyo (JP); Yoshihiro Ikeda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 677 days.

(21) Appl. No.: 15/811,802

(22) Filed: Nov. 14, 2017

(65) Prior Publication Data
US 2018/0069522 A1    Mar. 8, 2018

Related U.S. Application Data

(63) Continuation of application No. PCT/JP2016/063923, filed on May 10, 2016.

(30) Foreign Application Priority Data

May 27, 2015  (JP) .............................. JP2015-107744

(51) Int. Cl.
*H03H 3/02*    (2006.01)
*H01L 23/02*   (2006.01)
(Continued)

(52) U.S. Cl.
CPC .............. *H03H 3/02* (2013.01); *H01L 23/02* (2013.01); *H01L 23/04* (2013.01); *H01L 23/08* (2013.01);
(Continued)

(58) Field of Classification Search
CPC .......... H03H 3/02; H01L 23/02; H01L 23/04; H01L 23/08
See application file for complete search history.

(56) References Cited

U.S. PATENT DOCUMENTS 5,825,120 A    10/1998   Maesaka et al.
9,735,340 B2   8/2017    Oishibashi et al.
(Continued)

FOREIGN PATENT DOCUMENTS

JP    H09-307397 A    11/1997
JP    2000-134055 A   5/2000
(Continued)

OTHER PUBLICATIONS

English Translation of JP 2000-134055 Ando (Year: 2000).*
(Continued)

*Primary Examiner* — Bryan P Gordon
(74) *Attorney, Agent, or Firm* — Arent Fox LLP

(57) ABSTRACT

A piezoelectric resonator unit that includes a piezoelectric resonator; a substrate that includes a mounting surface, an electrode pattern on the mounting surface; and a cap joined to the mounting surface of the substrate by a joining material such that the piezoelectric resonator is hermetically sealed. The electrode pattern includes a connection electrode to which the piezoelectric resonator is connected, and an extended electrode that is extended from the connection electrode towards an outer edge of the mounting surface. A joining region on the mounting surface is provided over an entire periphery and surrounds the connection electrode. An insulating material is in the joining region such that at least part of the electrode pattern is exposed therefrom.

18 Claims, 6 Drawing Sheets

(51) Int. Cl.
*H03H 9/05* (2006.01)
*H03H 9/10* (2006.01)
*H03H 9/02* (2006.01)
*H01L 23/04* (2006.01)
*H01L 23/08* (2006.01)

(52) U.S. Cl.
CPC ............ *H03H 9/02* (2013.01); *H03H 9/0519* (2013.01); *H03H 9/1021* (2013.01)

(56) References Cited

U.S. PATENT DOCUMENTS

| | | | | |
|---|---|---|---|---|
| 2004/0217673 | A1* | 11/2004 | Unno | H03H 9/1021 310/348 |
| 2010/0107389 | A1* | 5/2010 | Nessler | H03H 9/584 29/25.35 |
| 2012/0174360 | A1* | 7/2012 | Sato | H03H 9/105 29/25.35 |
| 2012/0181898 | A1* | 7/2012 | Hatakeyama | H03H 9/1042 310/313 B |
| 2014/0028155 | A1 | 1/2014 | Oishibashi et al. | |
| 2014/0191617 | A1* | 7/2014 | Ohashi | H01L 41/0533 310/348 |
| 2015/0001997 | A1* | 1/2015 | Saito | H01L 21/50 310/344 |
| 2016/0028348 | A1* | 1/2016 | Kushida | H01L 21/50 331/158 |
| 2016/0164490 | A1* | 6/2016 | Kamijo | H03H 3/02 310/348 |

FOREIGN PATENT DOCUMENTS

JP       2012-191648 A    10/2012
WO    WO 2012/140936 A1   10/2012

OTHER PUBLICATIONS

International Search Report issued in International Application No. PCT/JP2016/063923, dated Aug. 2, 2016.
Written Opinion issued in issued in International Application No. PCT/JP2016/063923, dated Aug. 2, 2016.

\* cited by examiner

PIEZOELECTRIC-RESONATOR-MOUNTING SUBSTRATE, AND PIEZOELECTRIC RESONATOR UNIT AND METHOD OF MANUFACTURING THE PIEZOELECTRIC RESONATOR UNIT

CROSS REFERENCE TO RELATED APPLICATIONS

The present application is a continuation of International application No. PCT/JP2016/063923, filed May 10, 2016, which claims priority to Japanese Patent Application No. 2015-107744, filed May 27, 2015, the entire contents of each of which are incorporated herein by reference.

FIELD OF THE INVENTION

The present invention relates to a piezoelectric-resonator-mounting substrate, and a piezoelectric resonator unit and a method of manufacturing the piezoelectric resonator unit.

BACKGROUND OF THE INVENTION

As a mode of a piezoelectric resonator unit used in, for example, an oscillation device or a bandpass filter, a structure including a quartz crystal blank, a substrate on whose surface the quartz crystal blank is mounted, and a metal cover that is joined to the substrate by using a sealing material is known (refer to, for example, Patent Document 1).

In such a structure, extended terminals are formed from corresponding quartz crystal holding terminals, which are at the center of the substrate and to which the quartz crystal blank is connected, towards corresponding outer edges thereof and on both sides of a joining region between the substrate and the metal cover. Therefore, steps are formed at the joining region by the extended terminals, and such steps cause relatively large gaps to be formed between the substrate and the metal cover. Since the sealing material does not easily flow into the gaps formed in this way, a void (air bubble) is formed at the joining region between the substrate and the metal cover, as a result of which the reliability in electrical connection may be lost due to, for example, the occurrence of leaks.

Patent Document 1: Japanese Unexamined Patent Application Publication No. 2012-191648

SUMMARY OF THE INVENTION

The present invention is made in view of such circumstances, and an object thereof is to suppress the occurrence of leaks and to increase the reliability in electrical connection.

A piezoelectric resonator unit according to an aspect of the present invention includes a piezoelectric-resonator; a substrate that includes a mounting surface on which the piezoelectric-resonator is mounted, an electrode pattern formed on the mounting surface; and a cap that is joined to the mounting surface of the substrate by a joining material such that the piezoelectric-resonator is hermetically sealed. The electrode pattern includes a connection electrode to which the piezoelectric-resonator is connected, and an extended electrode that is extended from the connection electrode towards an outer edge of the mounting surface. A joining region that is situated on the mounting surface of the substrate is provided over an entire periphery that surrounds the connection electrode. An insulating material is formed in the joining region such that at least part of the electrode pattern is exposed therefrom.

According to the above-described structure, since the insulating material is formed in the joining region, it is possible to, at a location above the joining region, reduce a level difference between a portion of the electrode pattern and a portion of the substrate, and to suppress the occurrence of a void in the joining material. Therefore, it is possible to reduce the occurrence of leaks and to increase the reliability in electrical connection.

In the above-described piezoelectric resonator unit, the insulating material may be formed in contact with the electrode pattern.

In the above-described piezoelectric resonator unit, of the joining region on the mounting surface, the insulating material may be formed on an entire portion where the substrate is exposed.

In the above-described piezoelectric resonator unit, a thickness of the insulating material may be equal to a thickness of the electrode pattern.

In the above-described piezoelectric resonator unit, the insulating material may be glass.

In the above-described piezoelectric resonator unit, the joining material may be a resin adhesive.

In the above-described piezoelectric resonator unit, the electrode pattern may further include a dummy pattern that is not electrically connected to the piezoelectric-resonator.

In the above-described piezoelectric resonator unit, the cap may have a recessed portion that opens so as to face the mounting surface of the substrate; an inner wall that is disposed at an opening edge that is formed in a standing manner from a bottom surface of the recessed portion may be positioned towards an inner side of the substrate than the insulating material; and the joining material may be interposed between the cap and the substrate towards the inner side of the substrate than the insulating material.

According to this structure, for example, when the joining strength of the joining material with respect to the substrate is higher than that with respect to the insulating material, it is possible to increase the joining strength between the cap and the substrate. Since the joining material is interposed at the inner side of the substrate, it is possible to increase the joining strength without spreading the joining material to an outer side portion from the outer edges of the cap.

In the above-described piezoelectric resonator unit, the cap may include a flange portion that protrudes from the opening edge in a direction from an opening center of the recessed portion to the opening edge.

According to this structure, since the joining area between the cap and the substrate can be made large, it is possible to increase the joining strength between the cap and the substrate, and to increase sealability.

A method of manufacturing a piezoelectric resonator unit according to an aspect of the present invention includes (a) forming a piezoelectric-resonator, (b) forming an electrode pattern on a mounting surface of a substrate, (c) mounting the piezoelectric-resonator on the mounting surface of the substrate, and (d) joining a cap to the mounting surface of the substrate by using a joining material such that the piezoelectric-resonator is hermetically sealed. The electrode pattern includes a connection electrode to which the piezoelectric-resonator is connected, and an extended electrode that is extended from the connection electrode towards an outer edge of the mounting surface. A joining region that is situated on the mounting surface of the substrate is provided over an entire periphery that surrounds the connection electrode. The method also comprises, after the (b) and before the (c), forming an insulating material in the joining region such that at least part of the electrode pattern is exposed.

According to the above-described structure, since the insulating material is formed on the joining region, it is possible to, at a location above the joining region, reduce a level difference between a portion of the electrode pattern and a portion of the substrate, and to suppress the occurrence of a void in the joining material. Therefore, it is possible to reduce the occurrence of leaks and to increase the reliability in electrical connection.

In the method of manufacturing the piezoelectric resonator unit, the joining material may be provided on the cap before joining the cap to the substrate.

A piezoelectric-resonator-mounting substrate according to an aspect of the present invention includes a mounting surface on which a piezoelectric-resonator is to be mounted, and an electrode pattern on the mounting surface. The electrode pattern includes a connection electrode to which the piezoelectric-resonator is to be connected when the piezoelectric-resonator is mounted, and an extended electrode that is extended from the connection electrode towards an outer edge of the mounting surface. A joining region that is to be joined to a cap by a joining material is provided on the mounting surface of the substrate so as to extend over an entire periphery that surrounds the connection electrode. An insulating material is formed in the joining region such that at least part of the electrode pattern is exposed.

According to the above-described structure, since the insulating material is formed on the joining region, when the cap is joined to the piezoelectric-resonator-mounting substrate by using the joining material, it is possible to, at a location above the joining region, reduce a level difference between a portion of the electrode pattern and a portion of the substrate, and to suppress the occurrence of a void in the joining material. Therefore, it is possible to reduce the occurrence of leaks and to increase the reliability in electrical connection.

According to the present invention, it is possible to suppress the occurrence of leaks, and to increase the reliability in electrical connection.

DETAILED DESCRIPTION OF THE PREFERRED EMBODIMENTS

An embodiment of the present invention is described below. In the description of the drawings below, the same or similar structural elements are given the same or similar symbols. The drawings are examples, and the dimension and form of each portion are a typical dimension and form. Accordingly, the technical scope of the invention of the present application should not be understood as being limited to the embodiment.

Figure 1:
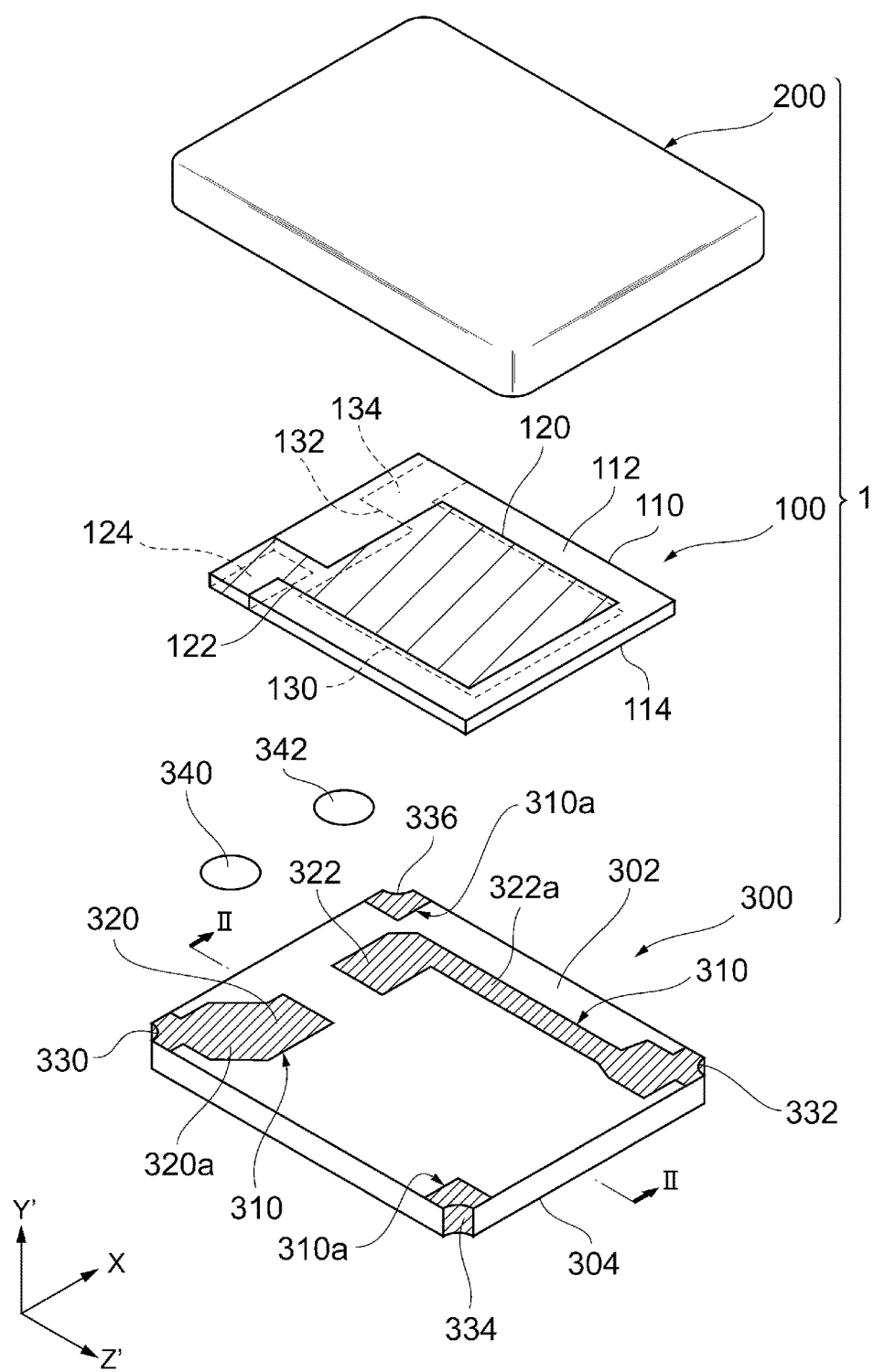
FIG. 1 is an exploded perspective view of a piezoelectric resonator unit according to an embodiment.
Figure 2:
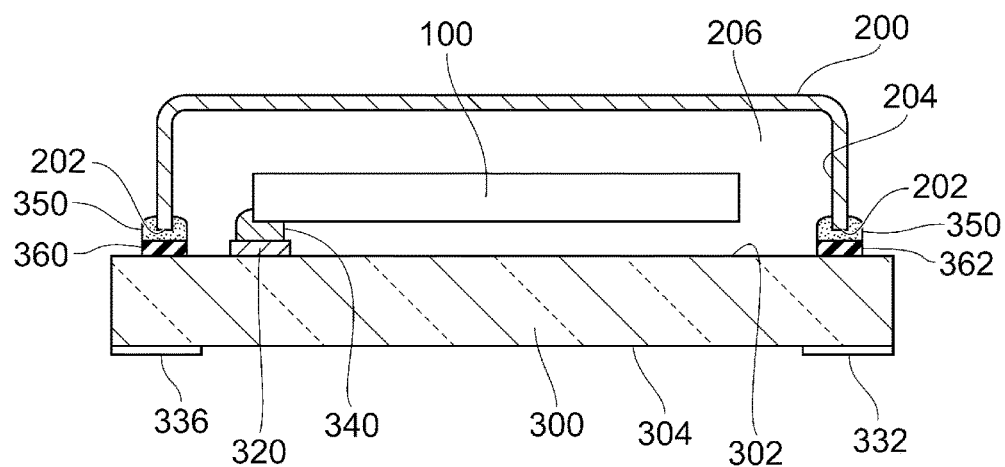
FIG. 2 is a sectional view along line II-II of FIG. 1.
Figure 3:
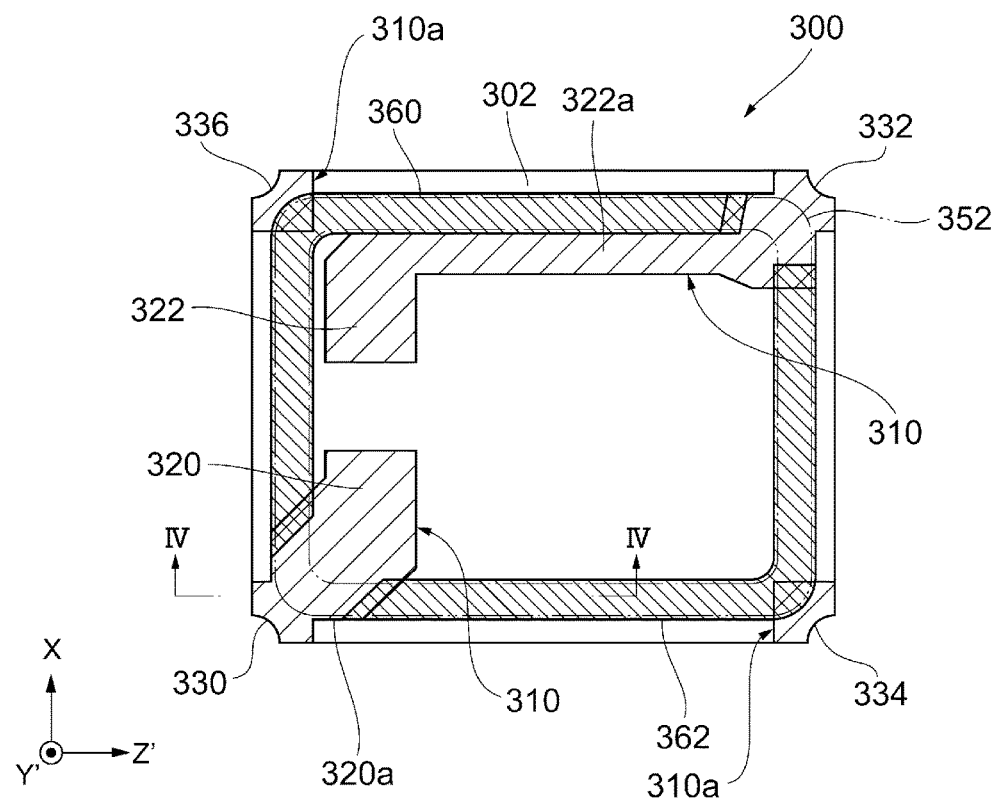
FIG. 3 is a plan view of a piezoelectric-resonator-mounting substrate according to the embodiment.
Figure 4:
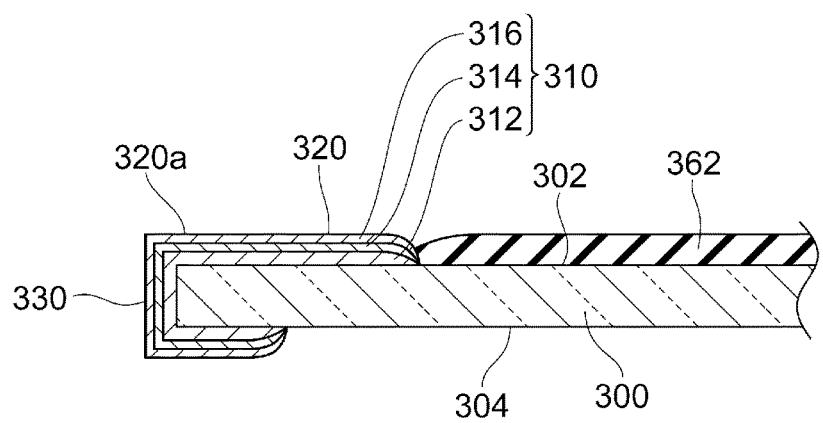
FIG. 4 is a sectional view along line IV-IV of FIG. 3.

A piezoelectric resonator unit according to an embodiment is described with reference to FIGS. 1 to 4. Here, FIG. 1 is an exploded perspective view of the piezoelectric resonator unit. FIG. 2 is a sectional view along line II-II of FIG. 1. FIG. 3 is a plan view of a piezoelectric-resonator-mounting substrate. FIG. 4 is a sectional view along line IV-IV of FIG. 3. FIG. 1 does not show insulating materials and a joining material shown in FIG. 2.

As shown in FIG. 1, the piezoelectric resonator unit 1 according to the embodiment includes a piezoelectric resonator 100, a cap 200, and a substrate 300. The cap 200 and the substrate 300 are a case or a package for accommodating the piezoelectric resonator 100.

The piezoelectric resonator 100 includes a piezoelectric substrate 110, and a first excitation electrode 120 and a second excitation electrode 130 that are formed on the piezoelectric substrate 110. The first excitation electrode 120 is formed on a first surface 112 of the piezoelectric substrate 110. The second excitation electrode 130 is formed on a second surface 114 that is opposite to the first surface 112 of the piezoelectric substrate 110.

The piezoelectric substrate 110 is made of a predetermined piezoelectric material. The material thereof is not limited to a particular material. The piezoelectric substrate 110 may be, for example, a quartz crystal substrate. In the example shown in FIG. 1, the piezoelectric resonator 100 is a quartz crystal vibration element including the piezoelectric substrate 110, which is an AT-cut quartz crystal substrate. The AT-cut quartz crystal substrate is one in which when, of an X axis, a Y axis, and a Z axis, which are crystal axes of artificial quartz crystals, the Y axis and the Z axis are rotated by 35 degrees and 15 minutes±1 minute and 30 seconds around the X axis in a direction from the Y axis to the Z axis, and when resulting axes are defined as a Y' axis and a Z' axis, surfaces that are parallel to surfaces specified by the X axis and the Z' axis (hereunder referred to as "XZ' surfaces"; other surfaces specified by other axes are similarly specified) are cut out as principal surfaces. In the example shown in FIG. 1, the piezoelectric substrate 110, which is an AT-cut quartz crystal substrate, has a longitudinal direction parallel to a Z'-axis direction, a lateral direction parallel to an X-axis direction, and a thickness direction parallel to a Y'-axis direction; and the XZ' surfaces thereof have a substantially rectangular shape. The quartz crystal vibration element that uses the AT-cut quartz crystal substrate has a very high frequency stability in a wide temperature range, and may be manufactured with good temporal change characteristics. The AT-cut quartz crystal vibration element often uses a thickness shear mode as a principal vibration mode.

The piezoelectric substrate according to the embodiment is not limited to that described above; and may be, for example, an AT-cut quartz crystal substrate having a longitudinal direction parallel to the X-axis direction and a lateral direction parallel to the Z'-axis direction, a quartz crystal substrate of a cut type other than an AT-cut type, or a piezoelectric substrate made of a piezoelectric material other than a quartz crystal, such as ceramic.

The first excitation electrode 120 is formed on the first surface 112 (XZ' surface on a positive-direction side of the Y' axis) of the piezoelectric substrate 110, and the second excitation electrode 130 is formed on the second surface 114

(that is, the XZ' surface on a negative-direction side of the Y' axis) opposite to the first surface 112 of the piezoelectric substrate 110. The first excitation electrode 120 and the second excitation electrode 130 are a pair of electrodes, and are disposed so that substantially the entire first excitation electrode 120 and the substantially entire second excitation electrode 130 overlap each other at their XZ' surfaces.

A connection electrode 124 is electrically connected to the first excitation electrode 120 via the extended electrode 122, and a connection electrode 134 is electrically connected to the second excitation electrode 130 via the extended electrode 132 are formed on the piezoelectric substrate 110. More specifically, the extended electrode 122 is extended from the first excitation electrode 120 towards a short side on a negative-direction side of the Z' axis on the first surface 112, is further extended past a side surface of the piezoelectric substrate 110 on the negative-direction side of the Z' axis, and is connected to the connection electrode 124 formed on the second surface 114. The extended electrode 132 is extended from the second excitation electrode 130 towards the short side on the negative-direction side of the Z' axis on the second surface 114, and is connected to the connection electrode 134 formed on the second surface 114. The connection electrodes 124 and 134 are disposed along the short side on the negative-direction side of the Z' axis, and are electrically connected to the substrate 300 and are mechanically held via conductive holding members 340 and 342 (described later). In the embodiment, the structures of the connection electrodes 124 and 134 and the structures of the extended electrodes 122 and 132 are not limited to particular structures, so that various changes can be made as appropriate by considering electrical connection with other members.

In the above-described electrodes including the first excitation electrode 120 and the second excitation electrode 130, for example, a foundation may be formed by forming a chromium (Cr) layer and a gold (Au) layer may be formed on a surface of the chromium layer. The materials thereof are not limited to certain materials.

The cap 200 includes a recessed portion 204 that opens so as to face a first surface 302 of the substrate 300. The cap 200 has opening edge portions 202 of the recessed portion 204. The opening edge portions 202 may be formed vertically in a standing manner from a bottom surface of the recessed portion 204. The material of the cap 200 is not limited to certain materials, and may be a metal material, an insulating material, or a composite material thereof.

The substrate 300 is a piezoelectric-resonator-mounting substrate including a mounting surface (the first surface 302) on which the piezoelectric resonator 100 is to be mounted. XZ' surfaces of the substrate 300 have a substantially rectangular shape. The substrate 300 may be made of, for example, insulating ceramic. Alternatively, the substrate 300 may be made of, for example, a glass material (such as silicate glass or a material containing a substance other than silicate as a main component and exhibiting glass transition phenomenon due to a temperature rise), a quartz crystal material (such as an AT-cut quartz crystal), or a glass epoxy material. It is desirable that the substrate 300 be made of a heat-resistant material. The substrate 300 may include a single layer or a plurality of layers, or may include a main body portion and an insulating film formed thereon. As shown in FIG. 2, when the cap 200 and the substrate 300 are both joined to each other, the piezoelectric resonator 100 is hermetically sealed in an internal space (cavity) 206 surrounded by the recessed portion 204 of the cap 200 and the substrate 300. In the example shown in FIG. 2, one end of the piezoelectric resonator 100 (end portion on the side of the conductive holding members 340 and 342) is a fixed end, and the other end thereof is a free end.

As shown in FIG. 1, an electrode pattern 310 is formed on the first surface 302 of the substrate 300. The electrode pattern 310 includes connection electrodes 320 and 322 to which the piezoelectric resonator 100 is connected, and extended electrodes 320a and 322a that extend from the corresponding connection electrodes 320 and 322 towards outer edges of the first surface 302.

The connection electrodes 320 and 322 are disposed inwardly of the outer edges of the substrate 300 so as to allow the piezoelectric resonator 100 to be disposed on a substantially central portion of the substrate 300. The connection electrode 124 of the piezoelectric resonator 100 is connected to the connection electrode 320 via the conductive holding member 340, and the connection electrode 134 of the piezoelectric resonator 100 is connected to the connection electrode 322 via the conductive holding member 342.

The extended electrode 320a extends from the connection electrode 320 towards one of the corner portions of the substrate 300, and the extended electrode 322a extends from the connection electrode 322 towards another corner portion of the substrate 300. A plurality of outer electrodes 330, 332, 334, and 336 are each formed on a corresponding one of the corner portions of the substrate 300. In the example shown in FIG. 1, the extended electrode 320a is connected to the outer electrode 330 formed on the corner portion in the negative direction of the X axis and on the negative-direction side of the Z' axis, and the extended electrode 322a is connected to the outer electrode 332 formed on the corner portion in the positive direction of the X axis and on a positive-direction side of the Z' axis.

In the embodiment, the electrode pattern 310 further includes dummy patterns 310a. The dummy patterns 310a are patterns that are not electrically connected to the first excitation electrode 120 and the second excitation electrode 130 of the piezoelectric resonator 100, and are made of a conductive material that is the same as that of the other electrodes. The dummy patterns 310a are formed near the remaining corner portions (corner portions other than the corner portions where the outer electrodes 330 and 332 electrically connected to the piezoelectric resonator 100 are disposed), and are connected to the other outer electrodes 334 and 336. The dummy patterns 310a may be electrically connected to terminals (terminals that are not connected to any other electronic elements) provided on a mounting substrate (not shown) on which the piezoelectric resonator unit 1 is mounted. When such dummy patterns 310a are formed, application of a conductive material for forming outer electrodes is facilitated. When outer electrodes are formed on all of the corner portions, a processing step of electrically connecting the piezoelectric resonator unit to other members is also facilitated.

In the example shown in FIG. 1, the corner portions of the substrate 300 each have a cutout side surface formed by cutting a portion thereof into a cylindrically curved shape (also called a castellation shape). The outer electrodes 330, 332, 334, and 336 are each continuously formed from such a cutout side surface to the second surface 304. The shape of the corner portions of the substrate 300 is not limited to such a shape. The shape of each cutout may be a planar shape, or the corner portions may be angular without cutouts.

The structures of the electrode pattern 310 and the outer electrodes are not limited to the above-described structures, and may be variously modified and used. For example, the connection electrodes 320 and 322 of the electrode pattern 310 may be disposed on different sides such that, for example, one of the connection electrodes 320 and 322 is formed on the positive-direction side of the Z' axis, and the other of the connection electrodes 320 and 322 is formed on the negative-direction side of the Z' axis. In such a structure, the piezoelectric resonator 100 is supported by the substrate 300 at two ends in the longitudinal direction. The number of outer electrodes is not limited to four, and may be, for example, two, each being disposed on a diagonal. The outer electrodes are not limited to those disposed on the corner portions, and may each be formed on any one of the side surfaces of the substrate 300 excluding the corner portions. In this case, as already described, each side surface may be formed into a cutout side surface formed by cutting a portion of the side surface into a cylindrically curved shape, and each outer electrode may be formed on a corresponding one of the side surfaces excluding the corner portions. Further, the dummy patterns 310a and the outer electrodes 334 and 336 connected thereto may be omitted.

In the piezoelectric resonator unit 1 shown in FIG. 1, when alternating current is applied to a portion between the pair of first excitation electrode 120 and the second excitation electrode 130 of the piezoelectric resonator 100 via the outer electrodes 330 and 332, the piezoelectric substrate 110 vibrates in a predetermined vibration mode, such as the thickness shear mode, and resonance characteristics resulting from the vibration can be obtained.

As shown in FIG. 3, in the embodiment, at a joining region 352 that is situated on the first surface 302 of the substrate 300 and that is joined to the cap 200, insulating materials 360 and 362 are formed such that at least part of the electrode pattern 310 is exposed. The insulating materials 360 and 362 are provided for at least partly eliminating a step formed at the first surface 302 by the formation of the electrode pattern 310, that is, for at least partly reducing a level difference between a portion of the electrode pattern 310 and a portion of the substrate 300.

More specifically, since the cap 200 is joined to the first surface 302 of the substrate 300 such that the piezoelectric resonator 100 is hermetically sealed, the joining region 352 is provided over the entire periphery that surrounds the connection electrodes 320 and 322 of the electrode pattern 310. When the outer electrodes 330, 332, 334, and 336 of the piezoelectric resonator 100 are formed on the outer edges of the substrate 300, since the extended electrodes 320a and 322a of the electrode pattern 310 on the first surface 302 are formed so as to traverse the joining region 352, at least steps formed by the extended electrodes 320a and 322a are formed at the joining region 352. When the dummy patterns 310a are also formed on the first surface 302, part of each dummy pattern 310a may be disposed at the joining region 352, as a result of which steps formed by the dummy patterns 310a are also formed. These steps cause relatively large gaps (spaces) to be formed between the steps and the cap 200 at a portion of the joining region 352 where the substrate 300 is exposed. A joining material 350 may not easily enter such gaps. When the cap 200 is to be joined to the substrate 300 via the joining material 350, the gaps may not be completely filled with the material of the joining material 350 on the joining region 352, as a result of which a void (air bubble) may remain.

Therefore, in the embodiment, at the joining region 352, the insulating materials 360 and 362 are formed such that at least part of the electrode pattern 310 is exposed. This causes the relatively large gaps between the first surface 302 of the substrate 300 and the cap 200 to be at least partly filled, as a result of which the material of the joining material 350 can uniformly enter the joining region 352, and the occurrence of a void in the joining material 350 can be suppressed. Therefore, it is possible to suppress leaks and to increase the reliability in electrical connection.

In the example shown in FIG. 3, of the joining region 352, the insulating material 360 is integrated with an exposed portion on the negative-direction side of the Z' axis and on a positive-direction side of the X axis, and the insulating material 362 is integrated with an exposed portion on the positive-direction side of the Z' axis and a negative-direction side of the X axis. This causes the insulating materials 360 and 362 to be formed on the entire portions of the joining region 352 where the substrate 300 is exposed. According to such a structure, since the insulating materials 360 and 362 are formed on the entire portions exposed from the electrode pattern 310, the material of the joining material 350 can more uniformly enter the joining region 352, and the occurrence of a void in the joining material 350 can be effectively suppressed.

As shown in FIG. 3, the insulating materials 360 and 362 may be formed in contact with the electrode pattern 310. For example, the insulating materials 360 and 362 may be formed so as to cover an upper surface near end portions of the extended electrodes 320a and 322a and the dummy patterns 310a.

The thicknesses of the insulating materials 360 and 362 (the heights from the first surface 302 of the substrate 300) may be substantially the same as the thickness of the electrode pattern 310 (for example, approximately 20 μm). In the example shown in FIG. 4, the electrode pattern 310 includes a plurality of layers 312, 314, and 316, (for example, an Ag layer, an Ni layer, and an Au layer from the side of the substrate); and the thickness from the substrate 300 to an upper surface of the electrode pattern 310 and the thickness from the substrate 300 to an upper surface of the insulating material 362 are the same. According to such a structure, since the upper surface of the electrode pattern 310 and the upper surface of the insulating material 362 are flush with each other, the material of the joining material 350 more uniformly enters the joining region 352, and the occurrence of a void in the joining material 350 can be more effectively suppressed. As shown in FIG. 4, when the insulating material 362 covers the upper surface near the end portion of the electrode pattern 310, a portion of the insulating material 362 above the electrode pattern 310 is thinly formed by an amount corresponding to the thickness of the electrode pattern 310 at a lower layer, so that the upper surface of the electrode pattern 310 and the upper surface of the insulating material 362 can be flush with each other.

The insulating materials 360 and 362 may each be, for example, a glass material (low-melting glass such as lead borate based materials and tin phosphate based materials). When glass materials are used for the insulating materials 360 and 362, it is possible to increase close-contact strength with the substrate 300 made of, for example, ceramic. Alternatively, instead of a glass material, inorganic materials other than glass materials, or organic materials, such as resin, may be used for the insulating materials 360 and 362.

As the joining material 350, for example, a resin adhesive may be used. The resin adhesive serving as the joining material 350 may be thermosetting resin, may be an epoxy based adhesive agent whose main component is, for example, epoxy resin. Alternatively, an inorganic material, such as a glass material, may be used for the joining material 350. When glass materials are used for the joining material 350 and the insulating materials 360 and 362, if these are separately formed by firing, an interface is formed between the joining material 350 and the insulating material 360 and between the joining material 350 and the insulating material 362, and the joining material 350 and the insulating materials 360 and 362 are each provided as a separate glass layer.

As described above, according to the piezoelectric resonator unit 1 or the piezoelectric-resonator-mounting substrate (substrate 300) according to the embodiment, since the insulating materials 360 and 362 are formed on the joining region 352, the material of the joining material 350 can uniformly enter the joining region 352, and the occurrence of a void in the joining material 350 can be suppressed. Therefore, it is possible to suppress leaks and to increase the reliability in electrical connection.

The structure of each insulating material is not limited to that described above, and may be variously modified and applied.

For example, although, in the above-described mode, the insulating materials 360 and 362 are described as being formed on the entire portions of the joining region 352 where the substrate 300 is exposed, the insulating materials may be formed on part of the portions of the joining region 352 where the substrate 300 is exposed (refer to a modifications below). In the above-described mode, at the frame-shaped joining region 352 having a width direction and a length direction, the insulating materials 360 and 362 and the electrode pattern 310 are described as being continuously provided along the length direction thereof. However, in a modification, portions of the insulating materials and a portion of the electrode pattern 310 may be positioned apart from each other. In another modification, a portion of each insulating material may extend to an outer side portion of the joining region 352. In the above-described mode, at the joining region 352, the insulating materials 360 and 362 are described as being formed such that a portion of the electrode pattern 310 is exposed. However, in a modification, at the joining region 352, the insulating materials may be formed such that the entire electrode pattern 310 is exposed (refer to a modification below). Further, the thickness of each insulating material is not limited to the aforementioned thickness, and may be, for example, slightly smaller than the thickness of the electrode pattern 310.

In the example shown in FIG. 2, as a mode in which the joining material 350 is provided on an upper surface of the insulating material 360, a mode in which the region of the joining material 350 and the region of the insulating material 360 are aligned is indicated. However, in a modification, the joining material 350 may be provided on a portion of the region of the insulating material 360, so that the other portion of the insulating material 360 may be exposed from the joining material 350. Alternatively, the joining material 350 may be provided so as to cover the entire upper surface of the insulating material 360 and so as to extend to an outer side portion of the insulating material 360 in such a manner as to include a portion that contacts the first surface 302 of the substrate 300.

Figure 5:
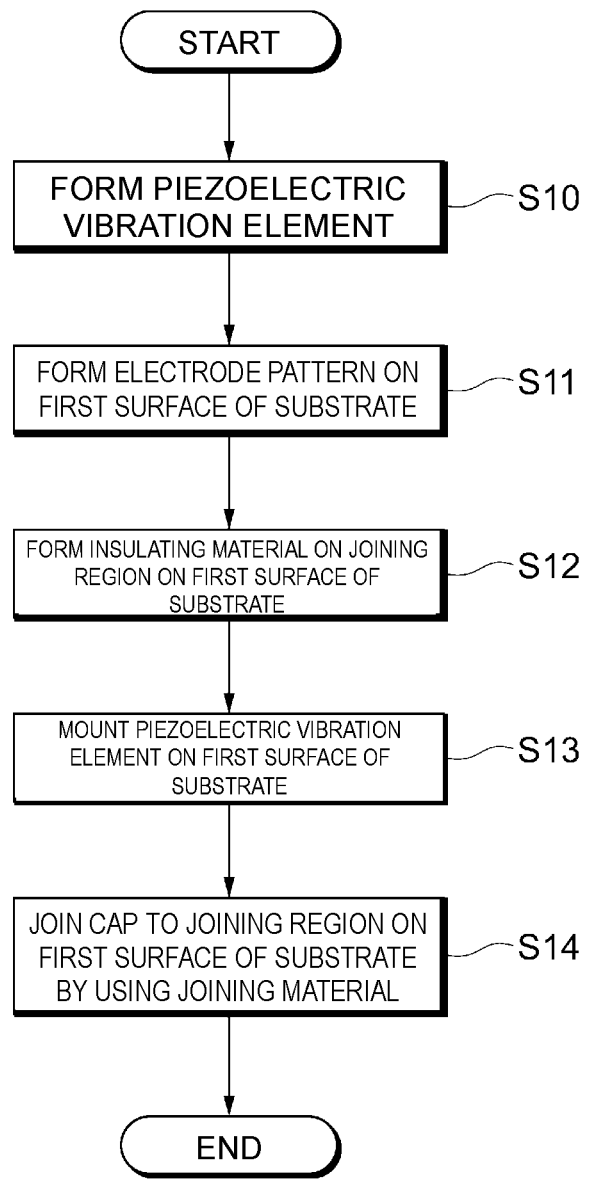
FIG. 5 is a flowchart of a method of manufacturing the piezoelectric resonator unit according to the embodiment.

Next, a method of manufacturing the piezoelectric resonator unit according to the embodiment is described on the basis of the flowchart of FIG. 5.

First, the piezoelectric resonator 100 is formed (S10). When a quartz crystal vibration element is to be formed as the piezoelectric resonator 100, first, a quartz crystal material is cut in the form of a wafer at a predetermined cut angle from artificial quartz crystal or natural quartz crystal stones, and the material in the form of a wafer is cut with a dicing machine or etched into a predetermined rectangular external shape. Then, the resulting material is subjected to, for example, a sputtering method or a vacuum deposition method to form various electrodes including the first excitation electrode 120 and the second excitation electrode 130 (refer to FIG. 1).

Next, the electrode pattern 310 is formed on the first surface 302 of the substrate 300 (S11). More specifically, for example, a conductive material in the form of a paste is applied to a predetermined region on the first surface 302 of the substrate 300, and the applied conductive material is fired, so that the electrode pattern 310 is formed. When the electrode pattern 310 is to include the dummy patterns 310a, the dummy patterns 310a are formed similarly to the connection electrodes 320 and 322 and the extended electrodes 320a and 322a. The electrode pattern 310 may be formed by, for example, a sputtering method or a vacuum deposition method. More specifically, in forming the electrode pattern 310 on the substrate 300, the layer 312 is formed by applying a conductive material in the form of a paste and then firing the conductive material, and then forming the layers 314 and 316 by plating.

Next, the insulating materials 360 and 362 are formed on the joining region 352 that is situated on the first surface 302 of the substrate 300 and that is joined to the cap 200 (S12). For example, when a glass material is used for each of the insulating materials 360 and 362, the glass material is applied to a portion of the joining region 352 that is exposed from the electrode pattern 310 by a printing method, such as a screen printing method, and the applied glass material is fired, so that the insulating materials 360 and 362 are formed. This makes it possible to uniformly provide the glass material on the first surface 302 of the substrate 300, so that it is possible to easily adjust the thickness of each of the insulating materials 360 and 362 to a desired thickness. The glass material may be fired before joining the cap 200 (described below), or the glass material may be subjected to temporary burning as required before joining the cap 200, and subjected to regular burning after joining the cap 200. The insulating materials 360 and 362 may cover the upper surface near the end portions of the electrode pattern 310.

Then, the piezoelectric resonator 100 is mounted on the first surface 302 of the substrate 300 (S13). More specifically, of the electrode pattern 310 on the first surface 302 of the substrate 300, the conductive holding members 340 and 342 are applied to the corresponding connection electrodes 320 and 322, the connection electrodes 124 and 134 of the piezoelectric resonator 100 are electrically connected to the connection electrodes 320 and 322 of the substrate 300 via the conductive holding members 340 and 342, and the conductive holding members 340 and 342 are solidified.

Thereafter, the cap 200 is joined to the joining region 352 on the first surface 302 of the substrate 300 by using the joining material 350 (S14). For example, it is possible to provide the joining material 350 in the form of a paste to the opening edge portions 202 of the cap 200 (refer to FIG. 2) by a dipping method or the like, and then join the cap 200 to the substrate 300 by using the joining material 350. A resin adhesive may be used as the joining material 350. After mounting the cap, the joining material 350 is heated at approximately 150° C. to 180° C. and solidified, so that the cap 200 and the substrate 300 are joined to each other. The resin adhesive can be joined at a relatively lower temperature than glass, allows the thermal stress exerted on the joining surface of the substrate 300, the joining material 350, and the cap 200 to be small, and allows the deformation of the cap 200 to be small. Alternatively, when the cap 200 is made of a metal material, the resin adhesive tends to become wet and provides good sealing performance. A glass material may be used for the joining material 350, and is fired after mounting the cap. In this case, it is desirable that the melting point of the joining material 350 be lower than those of the insulating materials 360 and 362. The joining can be easily and precisely performed by using a low-melting glass having a melting point of approximately 300° C. to 360° C. It is possible to suppress the entry of glass material into the internal space 206 that is humid and to improve reliability.

According to the method of manufacturing the piezoelectric resonator unit according to the embodiment, as already described in detail, since the insulating materials 360 and 362 are formed on the joining region 352, the material of the joining material 350 can uniformly enter the joining region 352, and the occurrence of a void in the joining material 350 can be suppressed. Therefore, it is possible to suppress leaks and to increase the reliability in electrical connection.

Figure 6:
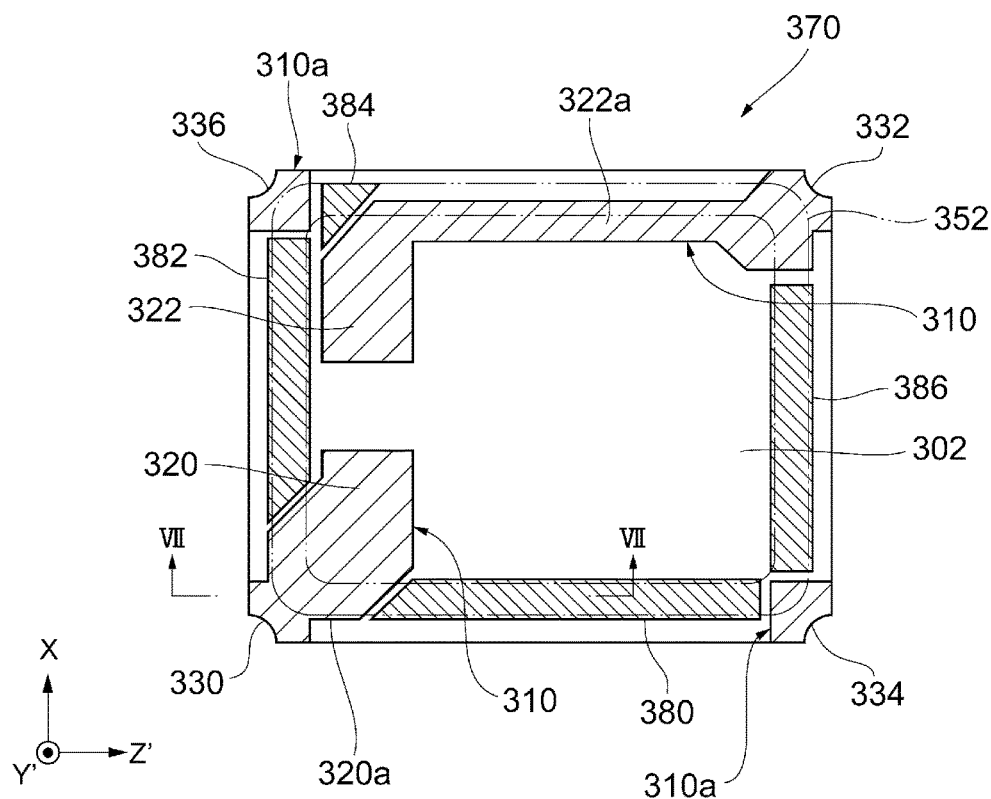
FIG. 6 is a plan view of a piezoelectric-resonator-mounting substrate according to a modification of the embodiment.
Figure 7:
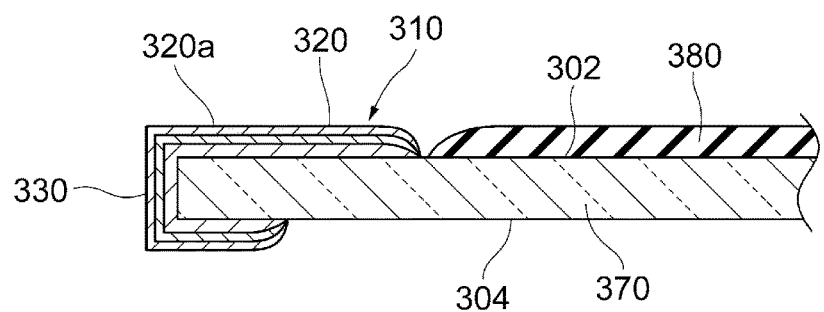
FIG. 7 is a sectional view along line VII-VII of FIG. 6.

The present invention is not limited to the above-described embodiment, and can be variously modified and applied. FIG. 6 is a plan view of a piezoelectric-resonator-mounting substrate according to a modification of the embodiment. FIG. 7 is a sectional view along line VII-VII of FIG. 6. In the description below, points that differ from those included in the aforementioned content are described, and structures that are the same as those in the aforementioned content are given the same reference numerals in the figures.

A piezoelectric resonator unit according to this modification includes a piezoelectric-resonator-mounting substrate 370, and the substrate 370 differs in the structures of insulating materials from those in the aforementioned content.

In the modification, insulating materials 380, 382, 384, and 386 are formed on the joining region 352 on the first surface 302 of the substrate 370 such that the entire electrode pattern 310 is exposed. More specifically, of the joining region 352, the insulating material 380 is formed on a portion thereof on the negative-direction side of the X axis where the substrate is exposed, the insulating material 382 is formed on a portion thereof on the negative-direction side of the Z' (axis) where the substrate is exposed, the insulating material 384 is formed on a portion thereof on the positive-direction side of the X axis where the substrate is exposed, and the insulating material 386 is formed on a portion thereof on the positive-direction side of the Z' axis where the substrate is exposed. As shown in FIG. 6, the insulating materials 380, 382, 384, and 386 may be formed apart from the electrode pattern 310 without being in contact with the electrode pattern 310. That is, as shown in cross section in FIG. 7, the first surface 302 of the substrate 370 may be exposed from a portion between the insulating material 380 and the electrode pattern 310.

According to the modification, since a relatively large gap between the first surface 302 of the substrate 370 and the cap is partly filled, the material of the joining material can uniformly enter the joining region 352, and the occurrence of a void in the joining material can be suppressed. Therefore, even in the modification, it is possible to suppress leaks and to increase the reliability in electrical connection.

Figure 8:
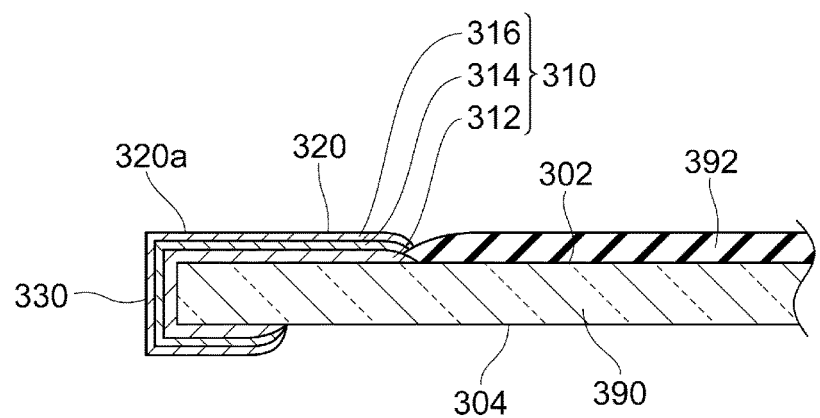
FIG. 8 is a sectional view of a piezoelectric-resonator-mounting substrate according to a modification of the embodiment.

FIG. 8 is a sectional view of a piezoelectric-resonator-mounting substrate according to a modification of the embodiment. In this example, the relationship between an insulating material 392 and the electrode pattern on a substrate 390 differs from that in the above-described modes. That is, as shown in FIG. 8, the insulating material 392 may cover an upper surface near an end portion of a lower layer 312 of the electrode pattern 310, and layers 314 and 316 of the electrode pattern 310 may cover an end portion of the insulating material 392. In a method of forming such an insulating material 392, first, the lower layer 312 of the electrode pattern 310 is formed; then, the insulating material 392 is formed so as to cover the vicinity of the end portion of the lower layer 312; thereafter, the layers 314 and 316 of the electrode pattern 310 are formed so as to cover the end portion of the insulating material 392. According to such a mode, since each layer of the electrode pattern 310 and the insulating material 392 are alternately formed, it is possible to reliably suppress the formation of a depression in a connection portion between the insulating material 392 and the electrode pattern 310.

Figure 9:
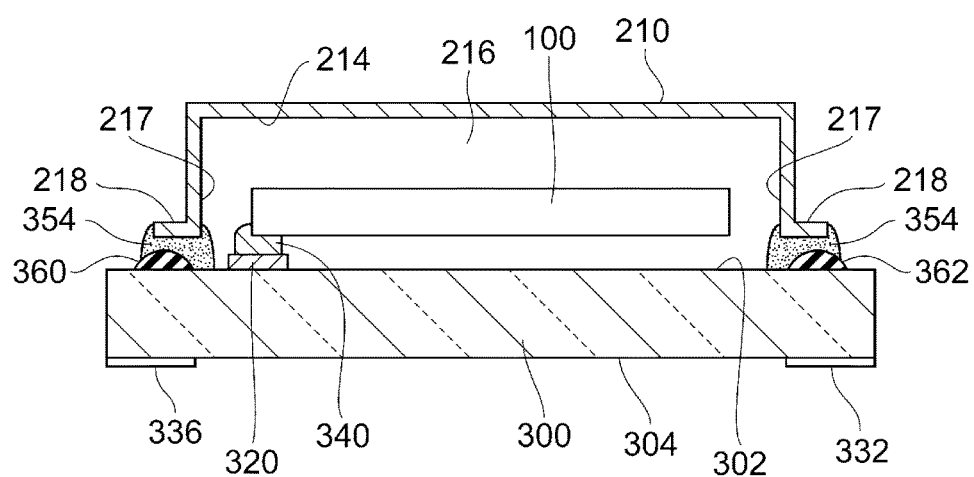
FIG. 9 is a sectional view of a piezoelectric resonator unit according to a modification of the embodiment.

FIG. 9 is a sectional view of a piezoelectric resonator unit according to a modification of the embodiment. In the example shown in FIG. 9, the structure of a cap and the relationship between the position of the cap and the insulating material relative to each other differ from those of the above-described modes.

The cap 210 may include a recessed portion 214 that opens so as to face the first surface 302 of the substrate 300, and the cap 210 may include a flange portion 218 that protrudes from opening edges in a direction from the opening center of the recessed portion 214 to the opening edges. According to this structure, since the size of a surface of the flange portion 218 facing the first surface 302 of the substrate 300 is large, the joining area between the cap 210 and the substrate 300 can be made large, and the joining strength between the cap 210 and the substrate 300 can be increased. Since the joining area therebetween is large, it is possible to increase the sealability of an internal space 216 in which the piezoelectric resonator 100 is accommodated.

In the example shown in FIG. 9, inner walls 217 that are disposed at the opening edges that are formed in a standing manner from a bottom surface of the recessed portion 214 are positioned towards an inner side of the substrate 300 (the center side of the substrate) than the insulating materials 360 and 362. A joining material 354 may be interposed between the cap 210 and the substrate 300 towards the inner side of the substrate 300 (the center side of the substrate) than the insulating materials 360 and 362. According to this structure, for example, when the joining strength of the joining material 354 with respect to the substrate 300 is higher than that with respect to the insulating materials 360 and 362, it is possible to increase the joining strength between the cap 210 and the substrate 300. For example, when the joining material 354 is a resin adhesive, the joining strength thereof with respect to the substrate 300 made of ceramic is higher than that with respect to the insulating materials 360 and 362 formed by using glass. Therefore, according to such a mode, it is possible to ensure a region where the joining material 354 directly contacts the substrate 300, and to increase the joining strength. Since the joining material 354 is interposed at the inner side of the substrate 300 (center side of the substrate), it is possible to increase the joining strength without spreading the joining material 354 to an outer side portion from the outer edges of the cap 210. The structure having such a relationship between the position of the cap and each of the insulating materials may be applied to, for example, the cap 200 shown in FIG. 2 that does not include a flange portion.

The above-described embodiments are each described to facilitate the understanding of the present invention, and are not to be construed as limiting the present invention. The present invention may be modified/improved without departing from the gist thereof, and includes equivalents thereof. That is, changes in design made by a person skilled in the art as appropriate to each embodiment are included within the scope of the present invention as long as they include the features of the present invention. For example, the elements, and the arrangements, materials, conditions, shapes, sizes, and the like of the elements in the embodiments are not limited to those exemplified, and may be changed as appropriate. The elements in the embodiments may be combined as long as it is technically possible, and such combinations are included within the scope of the present invention as long as they include the features of the present invention.

REFERENCE SIGNS LIST 1 piezoelectric resonator unit
100 piezoelectric resonator
200 cap
300 substrate (piezoelectric-resonator-mounting substrate)
302 first surface (mounting surface)
310 electrode pattern
310a dummy pattern
350 joining material
360 insulating material
362 insulating material

The invention claimed is:
1. A piezoelectric resonator unit comprising:
a piezoelectric-resonator;
a substrate having a mounting surface;
an electrode pattern on the mounting surface, the electrode pattern including a connection electrode and an extended electrode that extends from the connection electrode towards an outer edge of the mounting surface;
an insulating material within a joining region on the mounting surface of the substrate, wherein the joining region is provided over an entire periphery that surrounds the connection electrode, and the insulating material does not extend entirely across the electrode pattern in the joining region such that at least part of the electrode pattern is exposed from the insulating material in the joining region; and
a cap joined to the mounting surface of the substrate by a joining material such that the piezoelectric-resonator is hermetically sealed between the substrate and the cap.

2. The piezoelectric resonator unit according to claim 1, wherein the insulating material is in contact with the electrode pattern.

3. The piezoelectric resonator unit according to claim 1, wherein, in the joining region on the mounting surface, the insulating material is on an entire portion where the substrate is exposed.

4. The piezoelectric resonator unit according to claim 1, wherein a thickness of the insulating material is equal to a thickness of the electrode pattern.

5. The piezoelectric resonator unit according to claim 1, wherein the insulating material is glass.

6. The piezoelectric resonator unit according to claim 1, wherein the joining material is a resin adhesive.

7. The piezoelectric resonator unit according to claim 1, wherein the electrode pattern further includes a dummy pattern that is not electrically connected to the piezoelectric-resonator.

8. The piezoelectric resonator unit according to claim 1, wherein the cap has inner walls that define a cavity that faces the mounting surface of the substrate, wherein an inner wall of the inner walls at an opening edge from a bottom surface of the cavity is positioned more towards an inner side of the substrate than the insulating material, and
wherein the joining material is interposed between the cap and the substrate more towards the inner side of the substrate than the insulating material.

9. The piezoelectric resonator unit according to claim 8, wherein the cap includes a flange portion that protrudes from the opening edge in a direction from a center of the cavity toward the opening edge.

10. The piezoelectric resonator unit according to claim 1, wherein the cap includes a flange portion that protrudes from an opening edge in a direction away from a center of the cap.

11. A method of manufacturing a piezoelectric resonator unit, the method comprising:
mounting a piezoelectric-resonator to an electrode pattern on a mounting surface of a substrate, wherein the electrode pattern includes a connection electrode to which the piezoelectric-resonator is connected, and an extended electrode that is extended from the connection electrode towards an outer edge of the mounting surface;
forming an insulating material in a joining region on the mounting surface of the substrate such that the insulating material does not extend entirely across the electrode pattern in the joining region and at least part of the electrode pattern is exposed from the insulating material in the joining region, the joining region extending over an entire periphery that surrounds the connection electrode; and
joining a cap to the mounting surface of the substrate by using a joining material such that the piezoelectric-resonator is hermetically sealed between the cap and the substrate.

12. The method of manufacturing the piezoelectric resonator unit according to claim 11, wherein the joining material is provided on the cap before joining the cap to the substrate.

13. A piezoelectric-resonator-mounting substrate comprising:
a substrate having a mounting surface;
an electrode pattern on the mounting surface, wherein the electrode pattern includes a connection electrode, and an extended electrode that is extended from the connection electrode towards an outer edge of the mounting surface; and
an insulating material in a joining region on the mounting surface of the substrate, wherein the joining region is provided over an entire periphery that surrounds the connection electrode, and the insulating material does not extend entirely across the electrode pattern in the joining region such that at least part of the electrode pattern is exposed from the insulating material in the joining region.

14. The piezoelectric-resonator-mounting substrate according to claim 13, wherein the insulating material is in contact with the electrode pattern.

15. The piezoelectric-resonator-mounting substrate according to claim 13, wherein, in the joining region on the mounting surface, the insulating material is on an entire portion where the substrate is exposed.

16. The piezoelectric-resonator-mounting substrate according to claim 13, wherein a thickness of the insulating material is equal to a thickness of the electrode pattern.

17. The piezoelectric-resonator-mounting substrate according to claim 13, wherein the insulating material is glass.

18. The piezoelectric-resonator-mounting substrate according to claim 13, wherein the electrode pattern further includes a dummy pattern.

\* \* \* \* \*